United States Patent [19]

Suski

[11] Patent Number: 5,682,124
[45] Date of Patent: *Oct. 28, 1997

[54] TECHNIQUE FOR INCREASING THE RANGE OF IMPEDANCES FOR CIRCUIT BOARD TRANSMISSION LINES

[75] Inventor: Edward D. Suski, Lake Forest, Calif.

[73] Assignee: AST Research, Inc., Irvine, Calif.

[*] Notice: The term of this patent shall not extend beyond the expiration date of Pat. No. 5,300,899.

[21] Appl. No.: 526,201

[22] Filed: Sep. 11, 1995

Related U.S. Application Data

[63] Continuation of Ser. No. 427,500, Apr. 24, 1995, abandoned, which is a continuation of Ser. No. 342,631, Nov. 21, 1994, abandoned, which is a continuation of Ser. No. 109,160, Aug. 19, 1993, abandoned, which is a continuation-in-part of Ser. No. 12,547, Feb. 2, 1993, Pat. No. 5,300,899.

[51] Int. Cl.$^6$ .................................................. H01P 3/08
[52] U.S. Cl. ........................... 333/1; 174/254; 333/238; 333/243
[58] Field of Search .............................. 333/1, 236, 238, 333/243, 246; 174/36, 102 SP, 117 F, 117 FF, 117 M, 250, 254, 35 R, 35 MS; 361/818

[56] References Cited

U.S. PATENT DOCUMENTS

| | | | |
|---|---|---|---|
| 2,721,312 | 10/1955 | Grieg et al. | 333/238 |
| 3,612,744 | 10/1971 | Thomas | 333/243 X |
| 3,634,782 | 1/1972 | Marshall | 333/1 |
| 3,654,381 | 4/1972 | Copp . | |
| 3,700,825 | 10/1972 | Taplin et al. | 174/117 F X |
| 3,914,531 | 10/1975 | Zell et al. . | |
| 3,923,364 | 12/1975 | Shapiro et al. . | |
| 4,367,585 | 1/1983 | Elliot et al. . | |
| 4,408,255 | 10/1983 | Adkins . | |
| 4,437,138 | 3/1984 | Nicol . | |
| 4,642,592 | 2/1987 | Beeck | 333/246 |

(List continued on next page.)

OTHER PUBLICATIONS

Drawing of Parlex cable BNR NT4K1232 having 12 mil lines on mil centers (Sep. 30, 1992).
Drawing of Parlex cable BNR NT4K1232 having 10 mil lines on 20 mil centers (Sep. 30, 1992).
Drawing of Parlex cable BNR NT4K1234 having 12 mil lines on 25 mil centers (Sep. 30, 1992).
IBM Technical Disclosure Bulletin, vol. 33, No. 4, Sep. 1990, "Cross–Hatched Ground Plane" pp. 155–156.
Drawing of Parlex microstrip cable.
Enlarged drawing of portion of Parlex microstrip cable.
Sample of Mektec flexible cable (labeled "1").
Sample of Sheldahl flexible cable (labeled "2").
Sample of M–Flex flexible cable (labeled "3").

*Primary Examiner*—Paul Gensler
*Attorney, Agent, or Firm*—Knobbe, Martens, Olson & Bear LLP

[57] ABSTRACT

A shielded flexible cable includes a first shielding grid having conductive elements formed as squares. A second shielding grid is also formed as squares. The two shielding grids are positioned with respect to each other so that the vertices of the squares of the two grids are respectively offset from each other in each of two directions by one-half the diagonal distance between the vertices of the squares. Electrical signal conductors are positioned between the two grids along lines extending between the vertices of the squares to maintain a controlled impedance of the signal lines. A circuit board includes a reference plane configured as a grid having conductive elements formed as squares. Electrical signal conductors are positioned in a plane adjacent said grid. The decreased percent copper used to construct the grid increases the characteristic impedance of the signal conductors without increasing the thickness of the circuit board, without decreasing the width or thickness of the conductors and without using nonhomogeneous or nonstandard dielectrics. The circuit board provides the use of an increased range of impedance in signal conductors that permits the transfer of signals without degradation of the signal quality or loss of signal density, while providing an acceptable shielding capability.

36 Claims, 8 Drawing Sheets

U.S. PATENT DOCUMENTS

| | | | |
|---|---|---|---|
| 4,644,092 | 2/1987 | Gentry | 174/36 |
| 4,644,093 | 2/1987 | Yoshihara et al. . | |
| 4,689,262 | 8/1987 | Bloom . | |
| 4,695,694 | 9/1987 | Hill et al. . | |
| 4,695,810 | 9/1987 | Heckaman et al. | 333/236 X |
| 4,769,270 | 9/1988 | Nagamatsu et al. . | |
| 4,825,090 | 4/1989 | Grabis . | |
| 4,845,313 | 7/1989 | Endoh et al. . | |
| 4,855,537 | 8/1989 | Nakai et al. . | |
| 4,857,119 | 8/1989 | Karst et al. . | |
| 4,871,883 | 10/1989 | Guial | 333/243 X |
| 4,885,431 | 12/1989 | Kawakami et al. . | |
| 4,973,799 | 11/1990 | Soma et al. . | |
| 4,978,812 | 12/1990 | Akeyoshi et al. . | |
| 5,012,041 | 4/1991 | Sims et al. . | |
| 5,014,593 | 5/1991 | Auyer et al. . | |
| 5,110,651 | 5/1992 | Massard et al. . | |
| 5,112,648 | 5/1992 | Okonogi et al. . | |
| 5,177,324 | 1/1993 | Carr et al. . | |
| 5,195,243 | 3/1993 | Junod . | |
| 5,202,688 | 4/1993 | Hubbard et al. . | |
| 5,235,132 | 8/1993 | Ainsworth et al. . | |
| 5,236,736 | 8/1993 | Kawakami et al. . | |
| 5,293,004 | 3/1994 | Kawakami et al. . | |
| 5,296,651 | 3/1994 | Gurrie et al. . | |
| 5,300,899 | 4/1994 | Suski | 333/1 |
| 5,334,800 | 8/1994 | Kenney . | |

TECHNIQUE FOR INCREASING THE RANGE OF IMPEDANCES FOR CIRCUIT BOARD TRANSMISSION LINES

This application is a continuation of U.S. patent application Ser. No. 08/427,500, filed Apr. 24, 1995, abandoned, which was a continuation of U.S. patent application Ser. No. 08/342,631, filed Nov. 21, 1994, abandoned, which was a continuation of U.S. patent application Ser. No. 08/109,160, filed Aug. 19, 1993, abandoned which was a continuation of U.S. patent application Ser. No. 08/012,547, filed Feb. 2, 1993, U.S. Pat. No. 5,300,899.

BACKGROUND OF THE INVENTION

1. Field of Invention

The present invention relates generally to flexible cable and printed circuit board transmission lines, and, more particularly, to an apparatus and method for increasing the range of impedances for flexible cable and printed circuit board transmission lines.

2. Description of the Prior Art

The present invention relates to the controlling of impedance of data transmission lines in flat flexible cables and in printed circuit boards which have multiple conductors proximate to a ground reference plane.

Microstrips and striplines are extensively used to interconnect high-speed logic circuits in digital computers because they can be fabricated by automated techniques and can provide the required impedance-controlled signal paths. However, microstrip construction permits significant levels of extraneous electromagnetic radiation. Stripline construction can be utilized to greatly reduce unwanted electromagnetic radiation. However, the addition of a second reference or ground layer results in increased capacitive coupling between the signal conductor and the reference planes, thus greatly reducing the impedance of the signal conductor. In order to maintain the desired impedance, the distance between reference layers and the signal conductor in traditional stripling construction must be greater than in microstrip construction. This increased thickness significantly reduces the cables' ability to withstand multiple flexures, or, when used in a printed circuit board, increases the overall thickness of the printed circuit board.

Typically, conductors are formed in planes in a flexible cable or a printed circuit board. Ground planes or other reference voltage planes are positioned in planes parallel to the conductor planes to control the impedance of the conductors and to block the transmission of electromagnetic radiation from conductors carrying high frequency signals, such as clock signals and high speed data signals found in digital computers. In printed circuit boards, and the like, solid ground planes are generally used. However, solid ground planes are inflexible unless made very thin, and thus cannot be readily used to protect signal lines in cables that are intended to be frequently flexed, for instance, in the signal lines between the base and the movable display screen of a notebook computer. Furthermore, because of the large capacitance of a solid ground plane formed close to a signal line, the impedance of the signal lines may be lower than desired. On the other hand, if the ground plane is spaced further apart from the conductors to reduce the capacitance and thereby increase the impedance, a flexible cable becomes thicker and thus less flexible and more likely to break with repeated flexing. Similarly, a printed circuit board becomes thicker and thus more heavy and more costly to build.

Reference planes having conductive elements formed in a grid have been utilized in microstrip designs to increase the impedance and to provide flexibility. However, because the grid is not continuous like a solid reference plane, it has been found to be quite difficult to control the impedance of signal lines protected by a gridded reference plane because of the uncontrolled orientation of the signal lines with respect to the shielding grid. It is thus a goal of the present invention to provide a flexible cable and a circuit board that provides effective shielding and having a controllable characteristic impedance.

One of the particular difficulties in controlling the impedance characteristics of flexible cables and circuit boards utilizing cross-hatched reference planes, especially cables of stripline construction, has been in the structure of turns in the cable. Generally, when the orientation of a signal line needs to be changed, by, for example, 90 degrees or the like, the turn is not incorporated into the signal line with a single 90-degree turn. Rather, the change in orientation is generally accomplished by a arcuate turn (i.e., a curve) such that the orientation of the signal line varies continuously from its original orientation to the new orientation. It is likely that at various points in the turn, the signal line will be aligned with the conductors of the upper or lower grid or with both grids. Such alignment causes a significant reduction in impedance at such points and thus causes a substantial impedance discontinuity. Thus, another goal of the present invention is to provide a means of reorienting signal lines which minimizes impedance discontinuities.

Traditionally, the impedance of microstrip and stripline construction was determined by the signal conductor width, the separation of the conductor from the reference plane(s), the dielectric(s) that surround the conductor and, to a lesser degree, the thickness of the conductor.

However, such traditional methods of determining impedances in striplines and microstrips impose too many constraints on the designer. For example, in certain applications, such as the interconnection of peripheral components in the latest desktop and server systems, very high impedances on printed circuit boards are required. One way of obtaining such high impedances using existing technology is to increase the separation between the signal conductor and the reference plane. However, this would require the use of expensive printed circuit boards of nonstandard thicknesses. Such nonstandard printed circuit boards are not only expensive to implement, but also undesirable in many applications due to their bulk. It is thus a goal of the present invention to provide a circuit board which provides high impedance without increasing the thickness of the circuit board.

Alternatively, the microstrip designer may choose to increase signal conductor impedance by increasing the conductor's separation from the reference plane and reducing the conductor's width. There are, however, two limitations which restrict the designer in the implementation of the latter procedure. First, the minimum width of signal conductors is limited by present technology to approximately 4 mils. Secondly, the cost of fabricating a circuit board increases significantly when conductor widths fall below 6 mils.

Despite these restrictions, if "ordinary" board impedances of 50 to 65 Ω are also required on the same plane as the high impedance layers, it will be necessary to adjust the line widths of the conductors. Furthermore, conductors of "ordinary" impedance that are routed from other layers onto the high impedance layer would need to have their widths adjusted from layer to layer to maintain matched impedance along their entire length. Such matching, as a result of the increased line width, would result in a serious reduction in signal density on the high impedance layers. For instance, in matching high impedance layers of 90 Ω to ordinary board impedances of 50 to 65 Ω, signal density on the high impedance layers would decrease by a factor of approximately 2.7.

The conventional solution to this problem was to increase the signal layers. However, increasing the number of layers from 6 to 8 on, for example, a pre-existing mother board, would increase the cost of the printed circuit board by approximately $20.00 per board. It is thus another goal of the present invention to provide a circuit board with areas of increased impedance without increasing conductor separation from the reference plane or resorting to the use of expensive conductors and/or conductors that are too narrow to manufacture under current technology. It is also a goal of the present invention to provide such a circuit board while preventing a reduction in signal density and eliminating the need to add additional layers to the circuit board.

Another disadvantage associated with traditional microstrip construction is the generation of both forward and reverse crosstalk, which can seriously impair signal quality. Crosstalk is the effect of coupling the signal of one channel into another. Crosstalk may arise from a number of sources, one of which is the unbalance of cable parameters, in particular, the capacitance and inductance between conductors. Due to this unbalance, net coupling of the signal of one conductor into another can result. Such unbalance is generally aggravated when a conductor is exposed to nonhomogeneous media, as is the case with traditional microstrip construction. It is thus another goal of the present invention to provide a circuit board that exhibits reduced crosstalk while providing increased impedance.

In addition to the above limitations, surface conductors in traditional microstrip construction radiate high levels of electromagnetic radiation which interfere with the functioning of surrounding electronics. Conversely, extraneous radiation may also affect the operation of surface conductors. In traditional microstrip construction, it was not possible to provide adequate shielding because the surface of the conductor was free to radiate into the cavity of the system enclosing the circuit board. Containment of such radiation required that the conductor be constructed using stripline construction. However, high impedance conductors of stripline construction require that the separation between reference planes and conductors be increased drastically to reach the desired high impedance. Such an increase in thickness, would, however, be undesirable in applications where thin circuit boards or standard thickness circuit boards are required. It is thus another goal of the present invention to provide a circuit board that provides effective shielding while providing increased impedance.

Accordingly, there is a need in the art to provide a flexible cable having flexible reference planes, capable of thousands of flexures in a stripline design, and achieving a desired impedance that permits transfer of the signals without degradation to the signal quality while providing an acceptable shielding capability.

There is also a need in the art to provide a circuit board with increased impedance without increasing circuit board thickness, conductor width, conductor thickness or using either nonhomogeneous or nonstandard dielectric material, and achieving the desired increased impedance that permits the transfer of signals without degradation of the signal quality or loss of signal density, while providing an acceptable shielding capability.

SUMMARY OF THE INVENTION

One aspect of the present invention is a circuit board that comprises a first shielding grid having a first predetermined configuration comprising conductive elements interconnected in a geometric pattern. The circuit board further comprises a second shielding grid having a second predetermined configuration substantially identical to the first predetermined configuration. The second grid is aligned at a predetermined offset from the first grid. A conducting element is positioned between the first and second grids so that the conductor is positioned at a predetermined location with respect to the first and second grids. In preferred embodiments, the geometric pattern is a square.

A second aspect of the present invention is a method of constructing a flexible circuit board having shielded electrical signal conductors. The method comprises the steps of positioning a first shielding grid with a first predetermined configuration on one side of the signal conductors in a first plane. The configuration comprises a plurality of intersections of conductive elements. The method comprises the further step of positioning a second shielding grid with a second predetermined configuration substantially equal to the first predetermined configuration on an opposite side of the signal conductors in a second plane parallel to the first plane. The second grid is aligned with respect to the first grid so that intersections of conductive elements of the second grid have a predetermined offset from intersections of conductive elements of the second grid. The method comprises the further step of orienting the signal conductors along lines parallel to lines connecting the intersections of conductive elements of the grids.

A still further aspect of the present invention is a circuit board that comprises a first shielding grid with a first predetermined configuration defined in a first plane and a second shielding grid with a second predetermined configuration defined in a second plane. The second shielding grid is positioned with respect to the first shielding grid along a predetermined offset. The second circuit board further comprises a conducting element positioned between the first and second grids so that the conductor is positioned at a predetermined location with respect to the first and second grids.

Another aspect of the present invention is a method of constructing a circuit board, comprising the steps of positioning a first shielding grid with a first predetermined configuration in a first plane, positioning a second shielding grid with a second predetermined configuration in a second plane parallel to the first plane, and offsetting the second shielding grid from the first shielding grid in a predetermined direction in the second plane. The method comprises the further step of positioning a conducting element between the first and second grids so that the conductor is positioned at a predetermined location with respect to the first and second grids.

Another aspect of the present invention is a shielded flexible cable comprising a first shielding grid comprising a first plurality of conductive elements oriented in a first direction and a second plurality of conductive elements oriented in a second direction perpendicular to the first direction so that the first plurality of conductive elements and the second plurality of conductive elements form a plurality of squares. The squares have vertices corresponding to the intersections of the first and second pluralities of conductive elements. The vertices have a diagonal distance therebetween along diagonal directions at 45 degrees to the first and second directions. The flexible cable has a second shielding grid structurally identical to the first shielding grid.

The second shielding grid is positioned substantially parallel to the first shielding grid so that the intersections of the conductive elements of the first shielding grid are spaced apart from the intersections of the second shielding grid in the diagonal directions by a distance substantially equal to one-half the diagonal distance. A plurality of signal conductors are positioned between the shielding grids and oriented in a direction substantially parallel to one of the diagonal directions. Preferably, the signal conductors are oriented to pass proximate to the vertices of the squares.

A further aspect of the present invention is an improved circuit board that comprises a single shielding grid having a predetermined configuration of conductive elements interconnected in a geometric pattern, and a conducting element positioned adjacent to the grid so that the conducting element is positioned at a predetermined location with respect to the grid. Preferably, the circuit board further comprises a second conducting element adjacent to the grid in a direction opposite the first conducting element, wherein said second conducting element is positioned at a second predetermined location with respect to the first conducting element.

Another aspect of the present invention is a circuit board comprising a shielding grid having a predetermined configuration comprising conductive elements interconnected in a geometric pattern, a first conducting element positioned above the grid at a first predetermined location with respect to the grid, and a second conducting element positioned below the grid at a second predetermined location with respect to the first conducting element.

Another aspect of the present invention is a method of increasing the impedance on a circuit board having electrical signal conductors. The method comprises the step of positioning a single shielding grid with a predetermined configuration adjacent to the signal conductors. The configuration comprises a plurality of intersections of conductive elements. The method further comprises the step of orienting the signal conductors along lines parallel to lines connecting the intersections of the conductive elements of the grid.

Another aspect of the present invention is a circuit board that comprises a shielding grid with a predetermined configuration defined in a first plane, a first conducting element positioned above the grid so that the first conducting element is positioned at a first predetermined location with respect to the grid and a second conducting element positioned below said grid so that said second conducting element is positioned at a second predetermined location with respect to the first conducting element.

Another aspect of the present invention is a method of constructing a circuit board. The method comprises the steps of positioning a single shielding grid with a first predetermined configuration in a first plane, and positioning a conducting element in a second plane adjacent to the grid so that the conducting element is positioned at a predetermined location with respect to the grid.

Another aspect of the present invention is a circuit board that comprises a grid having a first plurality of conductive elements oriented in a first direction and a second plurality of conductive elements oriented in a second direction perpendicular to the first direction so that the first plurality of conductive elements and the second plurality of conductive elements form a plurality of squares, the squares having vertices corresponding to the intersections of the first and second pluralities of conductive elements. The vertices have a diagonal distance therebetween along diagonal directions at 45 degrees to the first and second directions. The circuit board further comprises a first plurality of signal conductors positioned adjacent the grid and oriented in a direction substantially parallel to one of the diagonal directions. A second plurality of signal conductors are positioned adjacent the grid, and oriented in a direction away from the first plurality of signal conductors, and in a direction substantially perpendicular to the first plurality of signal conductors.

DETAILED DESCRIPTION OF THE PREFERRED EMBODIMENT

Figure 1:
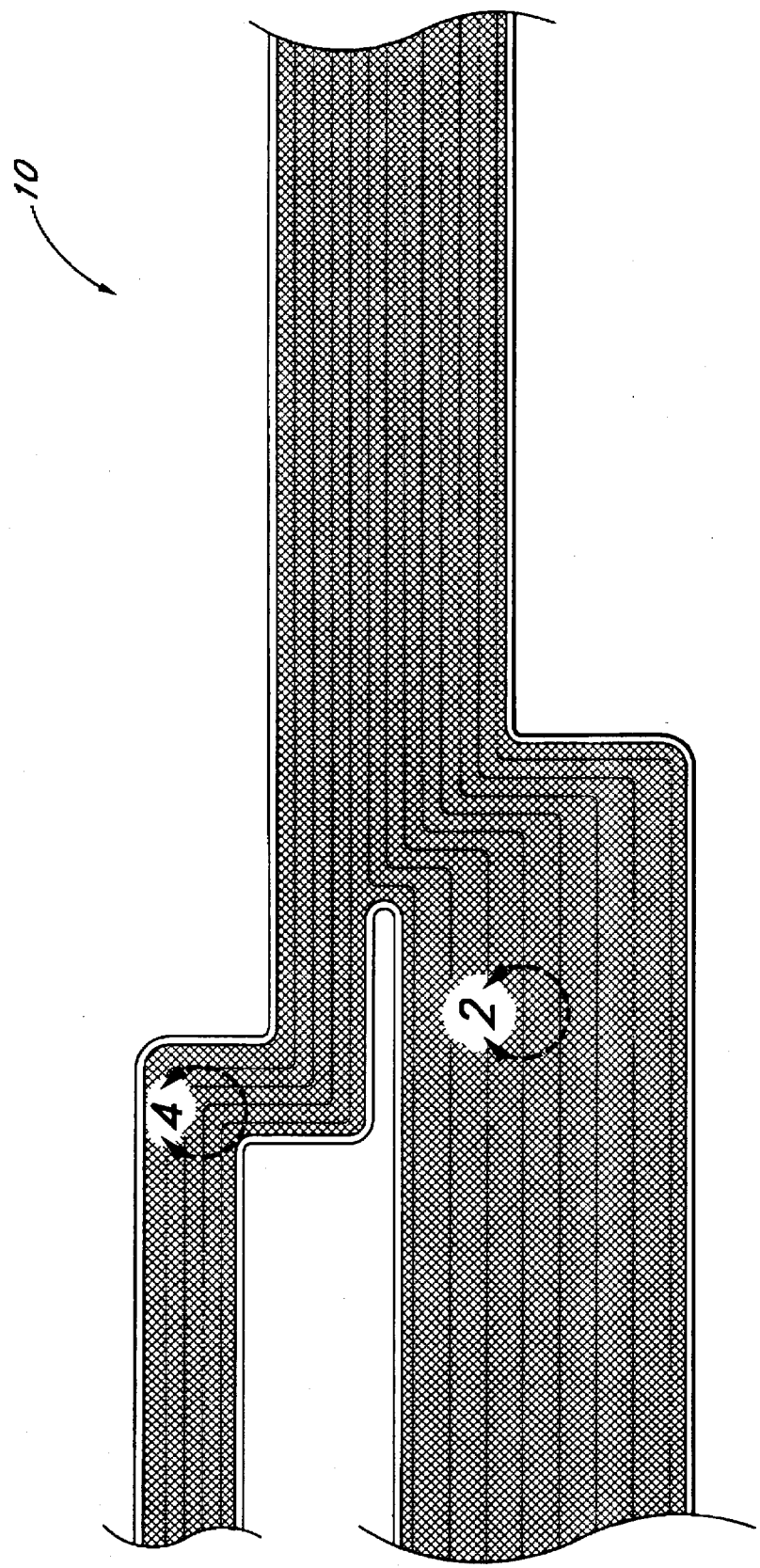
FIG. 1 depicts a plan view of a shielded flexible cable in accordance with the present invention.

FIG. 1 depicts a plan view of a shielded flexible cable 10 in accordance with the present invention. The cable 10 may be used to electrically connect the base and the movable display screen of a notebook computer.

Figure 2:
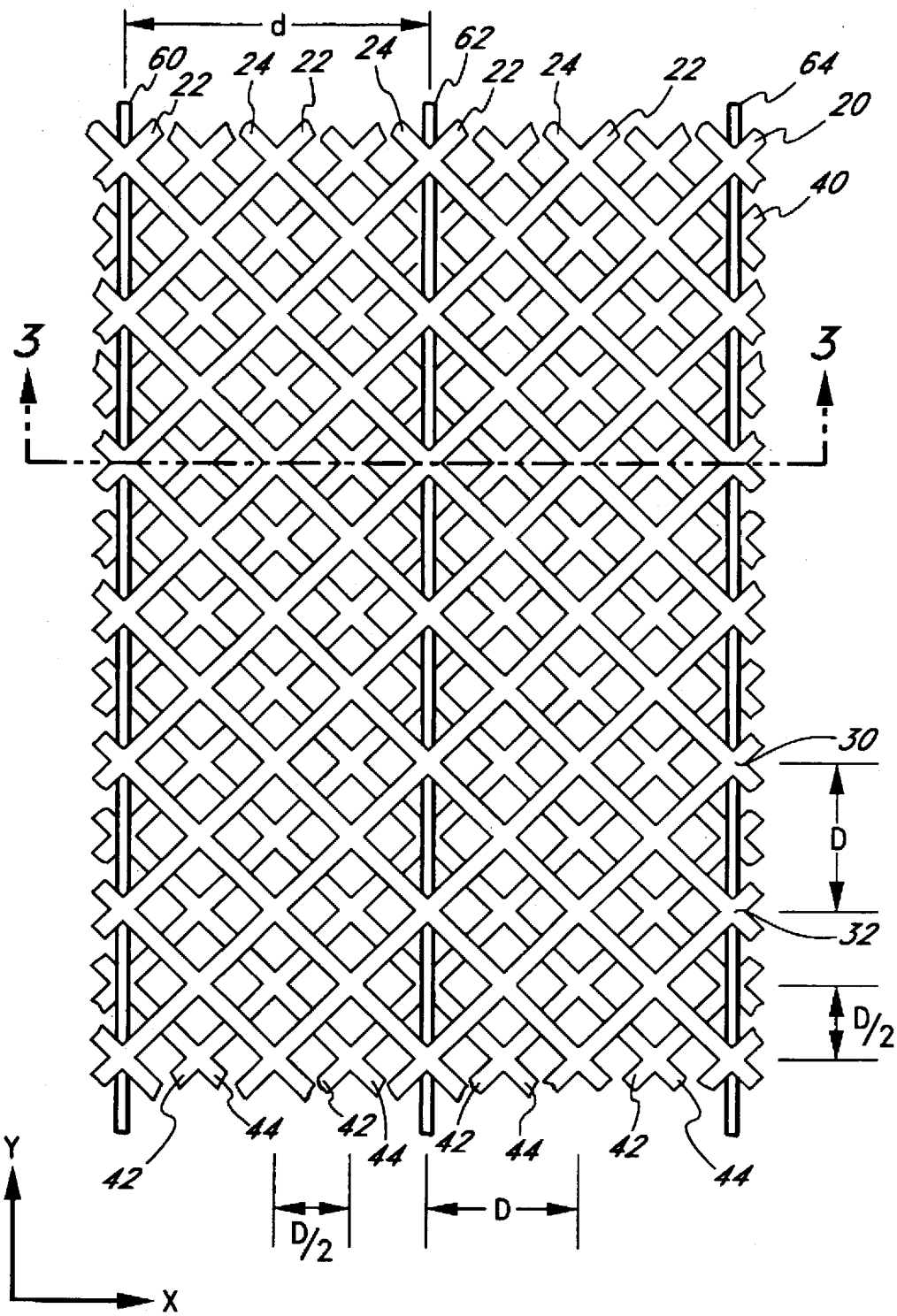
FIG. 2 depicts an enlarged view of a section 2—2 in FIG. 1.

As illustrated in FIG. 2, the circuit board 10 of the present invention comprises an upper shielding grid 20 comprising a set of electrically conductive elements, a lower shielding grid 40 comprising a like set of electrically conductive elements, and a plurality of signal conductors 60, 62, 64, all of which are aligned in predetermined locations with respect to one another as will be described below.

As illustrated in FIG. 2, each of the shielding grids 20, 40 has a uniform pattern, which in the preferred embodiment, is selected to be a repeating pattern of squares formed by the electrically conductive elements 22, 24 and 42, 44, respectively, that form the grids 20, 40. As illustrated, in the preferred embodiment, the elements 22 of the upper grid 20 are perpendicular to the elements 24, and the elements 42 of the lower grid 40 are perpendicular to the elements 44. Preferably, the grids 20 and 40 are formed by printed circuit board etching techniques by removing copper or other conductive material from a printed circuit board blank such that the conductive material remaining after etching forms the conductive elements 22, 24, 42, 44.

In particular, for reasons set forth below, the squares are oriented at 45 degrees with respect to the principle orientation of the signal conductors 60, 62, 64 such that the electrically conductive elements appear as cross-hatching with respect to the signal conductors 60, 62, 64.

Each of the grid squares has four vertices formed by the intersection of two of the electrically conductive elements 22, 24 or 42, 44 of the respective grids 20, 40. The diagonal distance between two oppositely disposed vertices, for example, a pair of vertices 30 and 32 of the upper grid 20, forms the greatest open distance D between any two conductive elements. The distance D can be considered as the size of a slot in the shielding. As is well known in the art of shielding electrical signals, if the slot size D is the largest opening of the grid, and if the distance is less than one-half the wavelength of the highest signal frequency propagating in any of the signal conductors 60, 62, 64, then the shielding grids 20, 40 form an effective barrier to the emission of electromagnetic energy from the signal conductors 60, 62, 64. It should be understood that an electrical clock signal having a frequency of 100 Mhz, for example, will have harmonics of many times that frequency. The harmonics of the highest signal frequency are considered when selecting the maximum allowable spacing for the electrically conductive elements of the shielding grids 20, 40. In the preferred embodiment, the distance D is selected to be less than 1/20 the size of the smallest expected wavelength of the signal traveling through the signal conductors 60, 62, 64.

Figure 3:
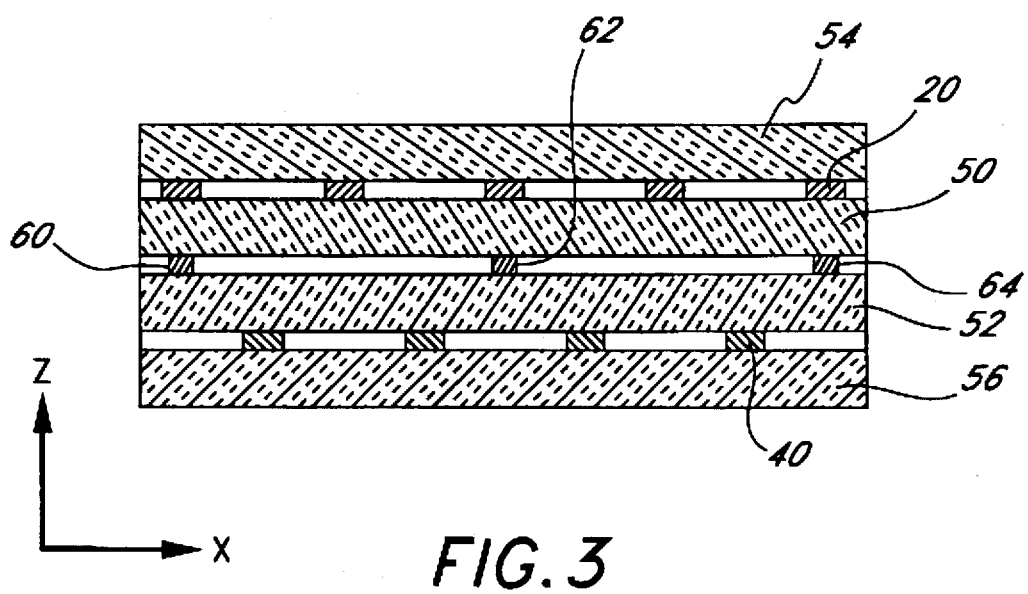
FIG. 3 depicts a cross-sectional elevational view of the present invention taken along the lines 3—3 in FIG. 2.

As illustrated in FIG. 3, the signal conductors 60, 62, 64 are located between the grids 20, 40 and are electrically insulated from the grids 20, 40 by an upper insulator 50 and a lower insulator 52. The upper surface of the upper grid 20 is laminated with an insulator 54. The bottom surface of the lower grid 40 is laminated with an insulator 56. The layers are sandwiched together and held in place by suitable adhesives known to the art. Preferably, the upper insulator 50 and the lower insulator 52 comprise an electrical insulator formed using a Z LINK® insulator from Sheldahl, Inc., of Northfield, Minn. The Z LINK insulator has the advantage that it is self-adhesive and that by suitable manufacturing techniques, electrical interconnections can be formed in the Z LINK® insulator to interconnect the shielding grids, 20, 40 together and/or to selected signal conductors 60, 62, 64 to ground the selected conductors. Such selected grounding is not part of the present invention and is not illustrated herein.

In order to more fully understand the following description, it is helpful to establish an X, Y, Z coordinate system for the drawing figures. The X and Y axes lie in a horizontal plane as shown in FIG. 2. Each of the upper grid 20 and the lower grid 40 are in planes parallel to the horizontal plane. Similarly, the signal conductors 60, 62, 64 lie in a plane between and parallel to the planes of the two grids 20, 40. The principal orientations of the signal conductors 60, 62, 64 are parallel to the Y axis, as illustrated in FIG. 2, or parallel to the X axis except when the orientation of the conductors are in transition between the principal orientations. The Z axis is perpendicular to the X and Y axes as shown in FIG. 3.

As illustrated in FIG. 2, the conductive elements of the upper grid 20 and the lower grid 40 are oriented so that the elements are oriented at 45 degrees to the X axis and the Y axis and so that the diagonals of the squares formed by the conductive elements are parallel to the X axis or parallel to the Y axis.

Referring to FIGS. 2 and 3, although the upper grid 20 and the lower grid 40 have substantially identical structure, the two grids are not positioned in alignment as would be expected. Rather, the upper grid 20 and the lower grid 40 are offset with respect to each other so that a vertex of a square in the upper grid 20 is offset from the nearest vertex of a square in the lower grid 40 by a distance of D/2 in both the X direction and the Y direction. Although the offset may be larger than or less than D/2, an offset of D/2 provides the maximum control of the impedance in the present invention. In particular, it can be seen that no conductive element of the upper grid 20 lies directly over, in the Z direction, any conductive element of the lower grid 40 for any significant distance. Rather, the conductive elements of the upper grid 20 cross the conductive elements of the lower grid 40 at right angles so that a minimal amount of capacitance is formed between the two grids 20, 40 at the intersections.

As further illustrated in FIG. 2, the signal conductors 60, 62, 64 are preferably positioned so that the signal conductors 60, 62, 64 extend from vertex to vertex of the squares defined by the conductive elements of the upper and lower grids 20, 40. With the signal conductors 60, 62, 64 positioned in this manner, the signal conductors 60, 62, 64 pass beneath a vertex of the upper grid 20 and then pass over a vertex of the lower grid 40. Thus, the signal conductors 60, 62, 64 do not lie between the elements of the upper grid 20 and the lower grid 40 at any location. This maintains a minimal capacitance between the signal conductors 60, 62, 64 and ground at all locations. Furthermore, by positioning all the conductors in the same positions with respect to the conductive elements of the upper and lower grids 20, 40, the characteristic impedances of the electrical conductors 60, 62, 64 can be effectively matched with respect to each other.

The impedance of the signal conductors 60, 62, 64 is a function of resistance, conductance, capacitance and inductance as follows:

$$Z_0 = \sqrt{\frac{R + j\omega L}{G + j\omega C}} \quad (1)$$

where $Z_0$ is the characteristic impedance of the signal conductors, R is the resistance, G is the conductance, $\omega$ is the frequency in radians (i.e., $2\pi f$), j is $\sqrt{-1}$, L is the inductance and C is the capacitance of the signal conductors.

At high frequencies, the impedance is primarily determined by the capacitance and the inductance, and Equation (1) reduces to:

$$Z_0 = \sqrt{\frac{L}{C}} \quad (2)$$

Thus, by reducing the capacitance to the signal conductors 60, 62, 64, the impedance of the signal conductors can be maintained sufficiently high to match the characteristic impedance of other circuit paths in an electronics system, such as a notebook computer or the like. For example, it is often desirable to provide a characteristic impedance of 50 ohms, an impedance frequently used in high frequency clock circuits.

Where a plurality of signal conductors are positioned in close proximity, such as the signal conductors 60, 62, 64 in FIG. 2, the conductors are preferably offset with respect to each other by a distance d that is a multiple of one-half the diagonal distance D between the vertices of the squares formed by the conductive elements of the upper grid 20 and the lower grid 40. That is:

$$\text{Offset} = n\left(\frac{D}{2}\right) \quad (3)$$

where n is an integer. This same positional relationship between the signal conductors 60, 62, 64 is preferably maintained even if the signal conductors 60, 62, 64 are not positioned to cross the grids at the vertices of the squares. For example, if one conductor is positioned to pass a small distance from the vertices of the squares, the other conductors should pass the same distance from the vertices so that the impedances of the conductors are substantially equal.

To obtain a circuit board that is capable of thousands of flexures, the thickness of the flexible cable in the Z direction must be kept to a minimum. However, the grids must have a sufficient amount of metal to withstand repeated flexes, such as the opening and closing of the display of a notebook computer. In one preferred embodiment of the present invention, a flexible cable having an overall thickness of 0.0085 inches is formed with a spacing of 0.005 inches between the shielding grids 20, 40 and with the signal conductors 60, 62, and 64 positioned approximately in the middle between the two grids. With this thickness, it has been found that a grid having approximately 23% metal content (i.e., in each grid square, approximately 23% of the area is metal and approximately 77% of the area is open). This configuration provides an impedance of approximately 50 ohms.

For commercial purposes, it is desirable that the shielding provide an effectiveness of at least 20 decibels. It can be shown that the shielding effectiveness can be expressed as:

$$S = 20 \log \left( \frac{\lambda}{2l} \right) \quad (4)$$

With a 23% metal area, a spacing D of approximately 0.060 inches provides a shielding effectiveness of approximately 29 dB, well within the 20 dB required for commercial purposes.

Figure 4:
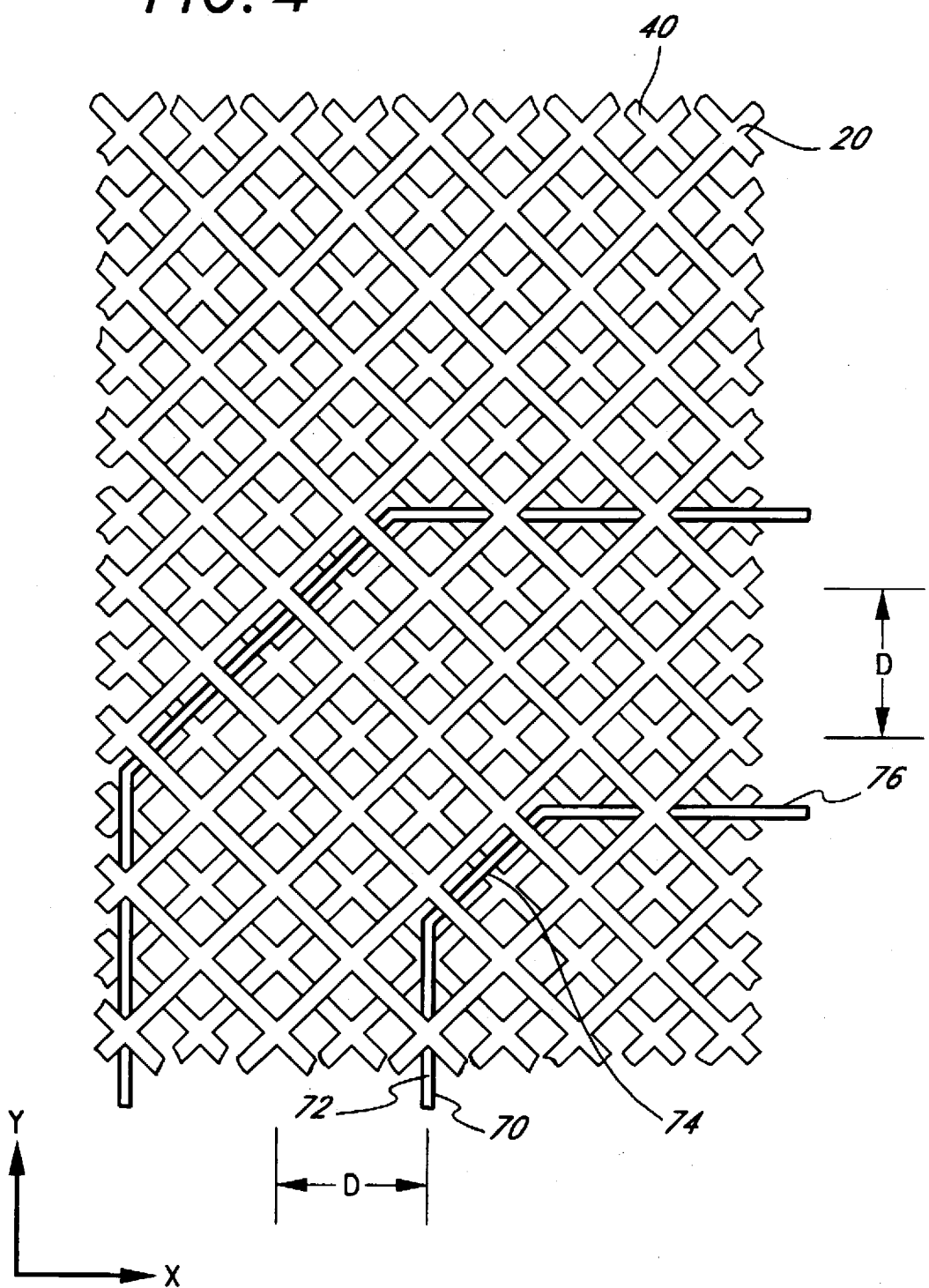
FIG. 4 depicts an enlarged plan view of a section 4—4 in FIG. 1 showing a method of making a 90-degree turn in a signal conductor.

Occasionally, the signal conductors 60, 62, 64 have to be rerouted for a variety of reasons, for instance, to conform to design layouts or to make connections between ports that are not aligned along a line parallel to the Y axis. In such cases, the signal conductors 60, 62, 64 have to be reoriented to make such connections. As illustrated in FIG. 4, such changes in direction may be accomplished while keeping the impedance discontinuities of the signal lines to a minimum. To accomplish a ninety degree change in direction, a signal conductor 70 comprising a first section 72 is oriented along the vertices of the grids 20, 40 in a direction parallel to the Y axis. The first section 72 extends into a second section 74 which is oriented at 45 degrees with respect to the first section. The second section 74 then extends into a third section 76 which is oriented at 45 degrees with respect to the second section 74 and thus 90 degrees with respect to the first section 72. As illustrated, the first 45-degree turn in the signal conductor 70 occurs approximately halfway between a vertex of the upper grid 20 and a vertex of the lower grid 40. The second section 74 of the conductor 70 travels along a path parallel to but spaced apart from the conductive elements of both the upper grid 20 and the lower grid 40. The second 45-degree turn occurs substantially halfway between vertices of the upper and lower grids, 20, 40, and the third section 76 then propagates from vertex to vertex as before, but parallel to the X axis rather than the Y axis.

The invention discussed above and depicted in FIG. 1-4 provides a flat cable or flexible circuit board having flexible reference planes, capable of thousands of flexures in a stripline design, and achieving a desired impedance that permits transfer of the signals without degradation to the signal quality while providing an acceptable shielding capability. This design is based on a pair of symmetrical, shifted reference planes and centered stripline conductors. It is particularly useful in applications where a thin flexible circuit, of approximately 5 mils, is required.

However, there also exists a need in the art to provide a circuit board with increased impedance without resorting to one of the traditional methods which have side effects. For example, increasing the spacing between the signal line and the shield decreases the capacitance and thus increases the impedance; however, the increased spacing will likely increase the circuit board thickness, which is undesirable in many applications. The capacitive coupling between the signal lines and the shield may be decreased by decreasing the conductor width or the conductor thickness which also can increase the impedance. But again, such changes may be undesirable. In addition, the impedance may be varied by using either nonhomogeneous or nonstandard dielectric material. There is the additional need in the art to achieve this desired increased impedance that permits the transfer of signals without degradation of the signal quality or loss of signal density, while providing an acceptable shielding capability. Such goals can be met by the invention discussed in detail below.

Figure 5:
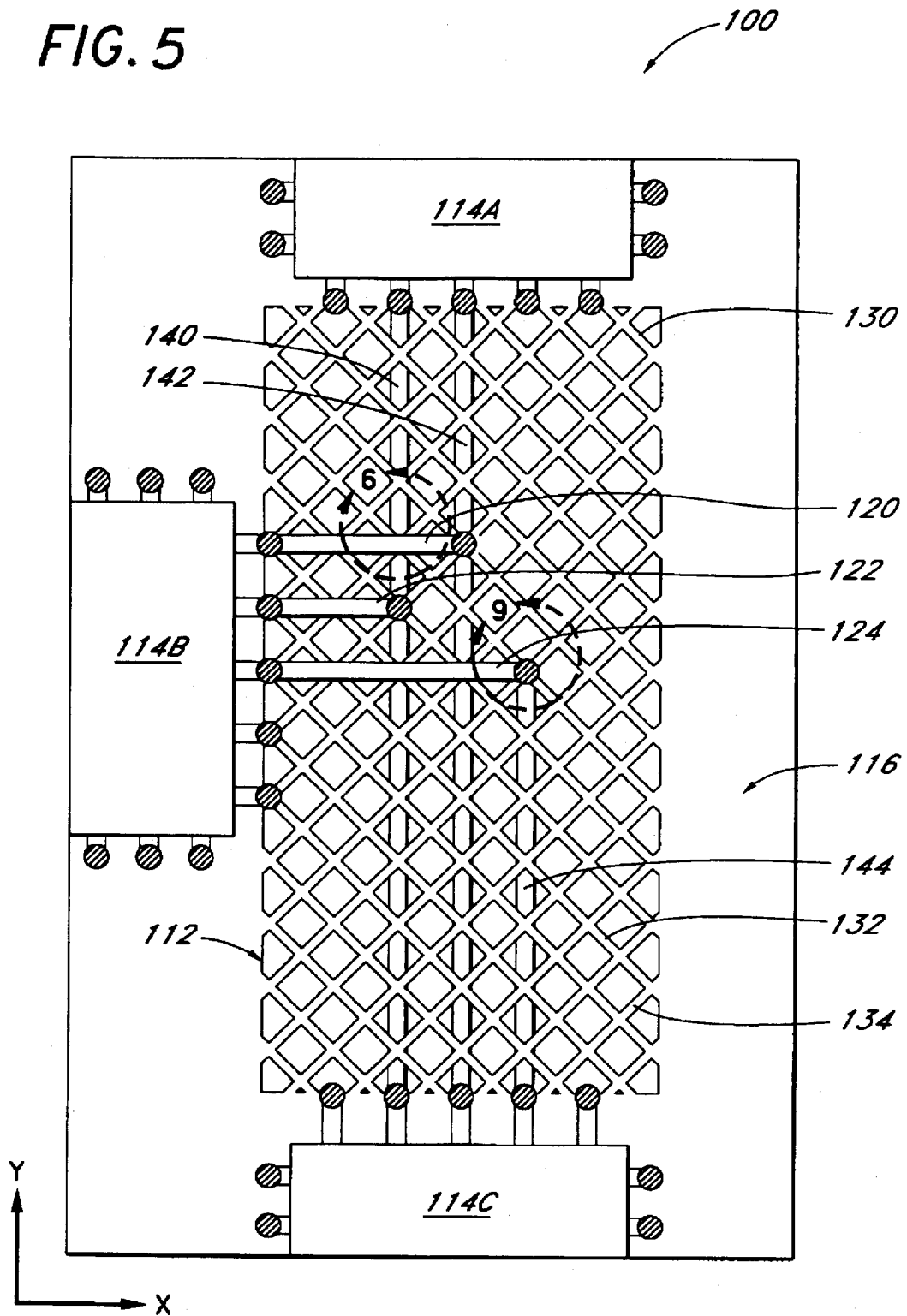
FIG. 5 depicts a plan view of a preferred embodiment of circuit board transmission lines in accordance with the present invention.

FIG. 5 depicts a plan view of a preferred embodiment of the printed circuit board 100 of the present invention, implemented as a high impedance bus 112. As depicted in FIG. 5, the high impedance bus 112 may be implemented as one section of a printed circuit board. This permits interconnection between integrated circuits 114A, 114B, 114C along the bus 112 which have to be connected via high impedance conductors. A solid ground plane 116 surrounds the high impedance area 112 so that routing of "ordinary" impedance signals is possible. Alternatively, the high impedance area 112 may be utilized in several sections or comprise an entire layer on the circuit board 100.

As illustrated in FIG. 5, the circuit board 100 of the present invention comprises a first plurality of signal conductors 120, 122, 124, a reference grid 130 comprising a set of electrically conductive elements, and a second plurality of signal conductors 140, 142, 144, all of which are aligned in predetermined locations with respect to one another as will be described below.

In an alternative embodiment of the present invention, the signal conductors 120, 122, 124 may be provided over the reference grid 130 without the presence of a second plurality of signal conductors below the grid 130. In yet another embodiment, the signal conductors 120, 122, 124 may be provided below the reference grid 130 without the presence of a second plurality of signal conductors over the grid 130.

As illustrated in FIG. 5, the reference grid 130 has a uniform pattern, which in the preferred embodiment, is selected to be a repeating pattern of squares formed by the electrically conductive elements 132, 134 which form the grid 130. As illustrated, in the preferred embodiment, the elements 132 of the grid 130 are perpendicular to the elements 134. Preferably, the grid 130 is formed by printed circuit board etching techniques by removing copper or other conductive material from a printed circuit board blank such that the conductive material remaining after etching forms the conductive elements 132, 134.

In particular, for reasons set forth below, the squares are oriented at 45 degrees with respect to the principle orientation of the signal conductors 120, 122, 124 such that the electrically conductive elements appear as cross-hatching with respect to the signal conductors 120, 122, 124. Likewise, the squares are oriented at 45 degrees with respect to the principle orientation of the signal conductors 140, 142, 144. However, for reasons set forth below, the signal conductors 120, 122, 124 are oriented at 90 degrees with respect to the signal conductors 140, 142, 144.

Figure 6:
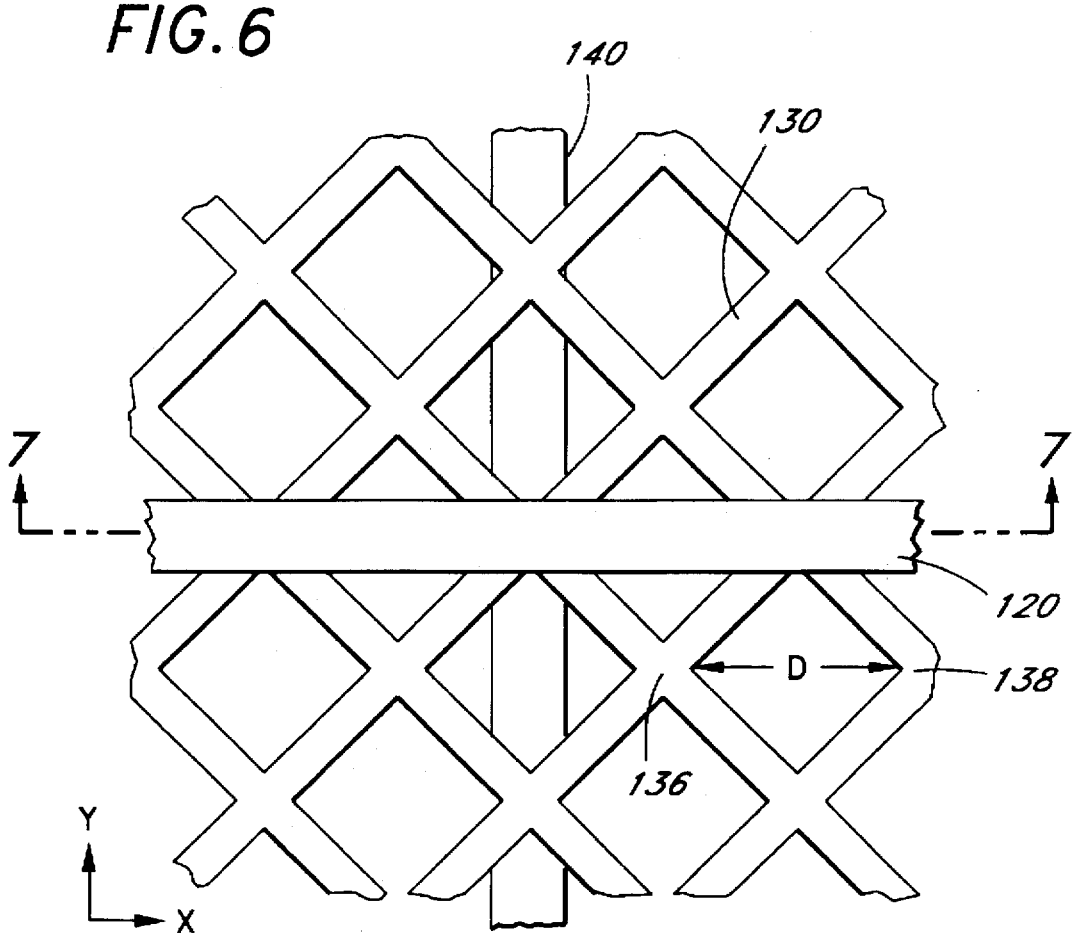
FIG. 6 depicts an enlarged plan view of a section 6—6 in FIG. 5.

FIG. 6 is an enlarged view of a section 6—6 from FIG. 5. Although only two signal conductors, namely conductor 120 and 140 are illustrated in FIG. 6, it is understood that they are depicted for illustrative purposes only, and that the following description applies to the signal conductors 120, 122, 124, 140, 142, and 144. As shown in FIG. 6, each of the grid squares has four vertices formed by the intersection of two of the electrically conductive elements 132, 134 of the grids 130. The diagonal distance between the two oppositely disposed vertices, for example, a pair of vertices 136 and 138 of the grid 130, forms the greatest open distance D between any two conductive elements. The distance D can be considered as the size of a slot in the reference grid 130. As is well known in the art of shielding electrical signals, if the slot size is the largest opening of the grid, and if the distance is less than one-half the wavelength of the highest signal frequency propagating in any of the signal conductors 120, 122, 124, 140, 142, 144, then the reference grid 130 forms an effective barrier to the emission of electromagnetic energy from the signal conductors 120, 122, 124, 140, 142, 144. It should be understood that an electrical clock signal having a frequency of 100 MHz, for example, will have harmonics of many times that frequency. The harmonics of the highest signal frequency are considered when selecting the maximum allowable spacing for the electrically conductive elements of the reference grid 130. In the preferred embodiment, the distance D is selected to be less than 1/20 the size of the smallest expected wavelength of the signal traveling through the signal conductors 120, 122, 124, 140, 142, 144.

Figure 7:
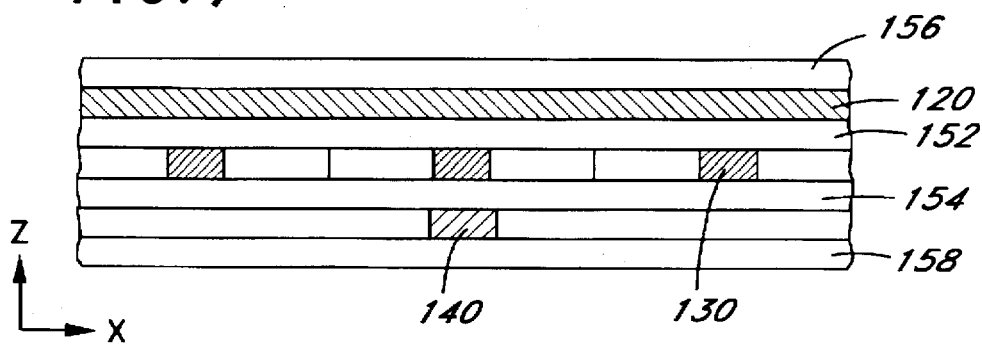
FIG. 7 depicts a cross sectional elevational view of the enlarged plan view of the present invention taken along lines 7—7 in FIG. 6.

As illustrated in FIG. 7, the upper signal conductors 120, 122, 124 are located above the grid 130 and the lower signal conductors 140, 142, 144 are located below the grid 130. As discussed above, the following description applies to the signal conductors 120, 122, 124, 140, 142, and 144 even though only conductors 120 and 140 are illustrated. The upper signal conductor 120 is electrically insulated from the grid 130 by an upper insulator 152, and the lower signal conductor 140 is electrically insulated from the grid 130 by a lower insulator 154. The upper surface of the upper signal conductor 120 is laminated with an insulator 156. The bottom surface of the lower signal conductor 140 is laminated with an insulator 158. The layers are sandwiched together and held in place by suitable adhesives known to the art.

In order to more fully understand the following description, it is helpful to establish an X, Y, Z coordinate system for the drawing figures. The X and Y axes lie in a horizontal plane as shown in FIGS. 5 and 6. The grid 130 is in a plane parallel to the horizontal plane. Similarly, the signal conductors 120, 122, 124 lie in a plane above and parallel to the plane of the grid 130. The signal conductors 140, 142, 144 also lie in a plane below and parallel to the plane of the grid 130. The principal orientations of the signal conductors 120, 122, 124 are parallel to the X axis, as illustrated in FIGS. 5 and 6. The corresponding principal orientations of the signal conductors 140, 142, 144 are parallel to the Y axis, as illustrated in FIGS. 5 and 6. Alternatively, the signal conductors 120, 122, 124 may be oriented parallel to the Y axis, with the corresponding signal conductors 140, 142, 144 oriented parallel to the X axis. For discussion purposes, the former orientation is utilized. The Z axis is perpendicular to the X and Y axes as shown in FIG. 7.

As illustrated in FIGS. 5 and 6, the conductive elements 132, 134 of the grid 130 are oriented so that the elements are oriented at 45 degrees to the X axis and the Y axis and so that the diagonals of the squares formed by the conductive elements 132, 134 are parallel to the X axis or parallel to the Y axis.

As further illustrated in FIG. 5, the signal conductors 120, 122, 124 are preferably positioned so that the signal conductors 120, 122, 124 extend from vertex to vertex of the squares defined by the conductive elements of the grid 130 along and parallel to the X-axis. Similarly, the signal conductors 140, 142, 144 extend from vertex to vertex of the squares defined by the conductive elements of the grid 130 along and parallel to the Y-axis. With the signal conductors 120, 122, 124 positioned in this manner, the signal conductors 120, 122, 124 pass over the vertices of the grid 130 parallel to the X axis and the signal conductors 140, 142, 144 pass below the vertices of the grid 130 parallel to the Y-axis. Thus, the signal conductors 120, 122, 124 and 140, 142, 144 do not lie between the elements of the grid 130 at any location. This maintains a minimal capacitance between the upper signal conductors 120, 122, 124 and ground and the lower signal conductors 140, 142, 144 and ground at all locations. Furthermore, by positioning all the conductors in the same positions with respect to the conductive elements of the grid 130, the characteristic impedances of the electrical conductors 120, 122, 124 can be effectively matched with respect to each other.

The impedance of low loss conductors such as the signal conductors 120, 122, 124, 140, 142, 144 is generally a function of resistance, conductance, capacitance and inductance as follows:

$$Z_0 = \sqrt{\frac{L}{C}} \left[ 1 + j \left( \frac{G}{2\omega C} - \frac{R}{2\omega L} \right) \right] \quad (5)$$

where $Z_0$ is the characteristic impedance of the signal conductors, R is the resistance, G is the conductance, $\omega$ is the frequency in radians (i.e., $2\pi f$), j is $\sqrt{(-1)}$, L is the inductance and C is the capacitance of the signal conductors.

At high frequencies, the impedance is primarily determined by the capacitance and the inductance, and Equation (5) reduces to:

$$Z_0 = \sqrt{\frac{L}{C}} \quad (6)$$

By reducing the capacitive coupling of the conductor to the reference plane, the value of C in the denominator of Equation (6) is reduced and the characteristic impedance is increased (i.e., the impedance is inversely proportional to the capacitance per unit length of the conductor). This has the apparent effect of moving the reference plane further away from the conductor which increases the characteristic impedance of the signal conductors.

Figure 8:
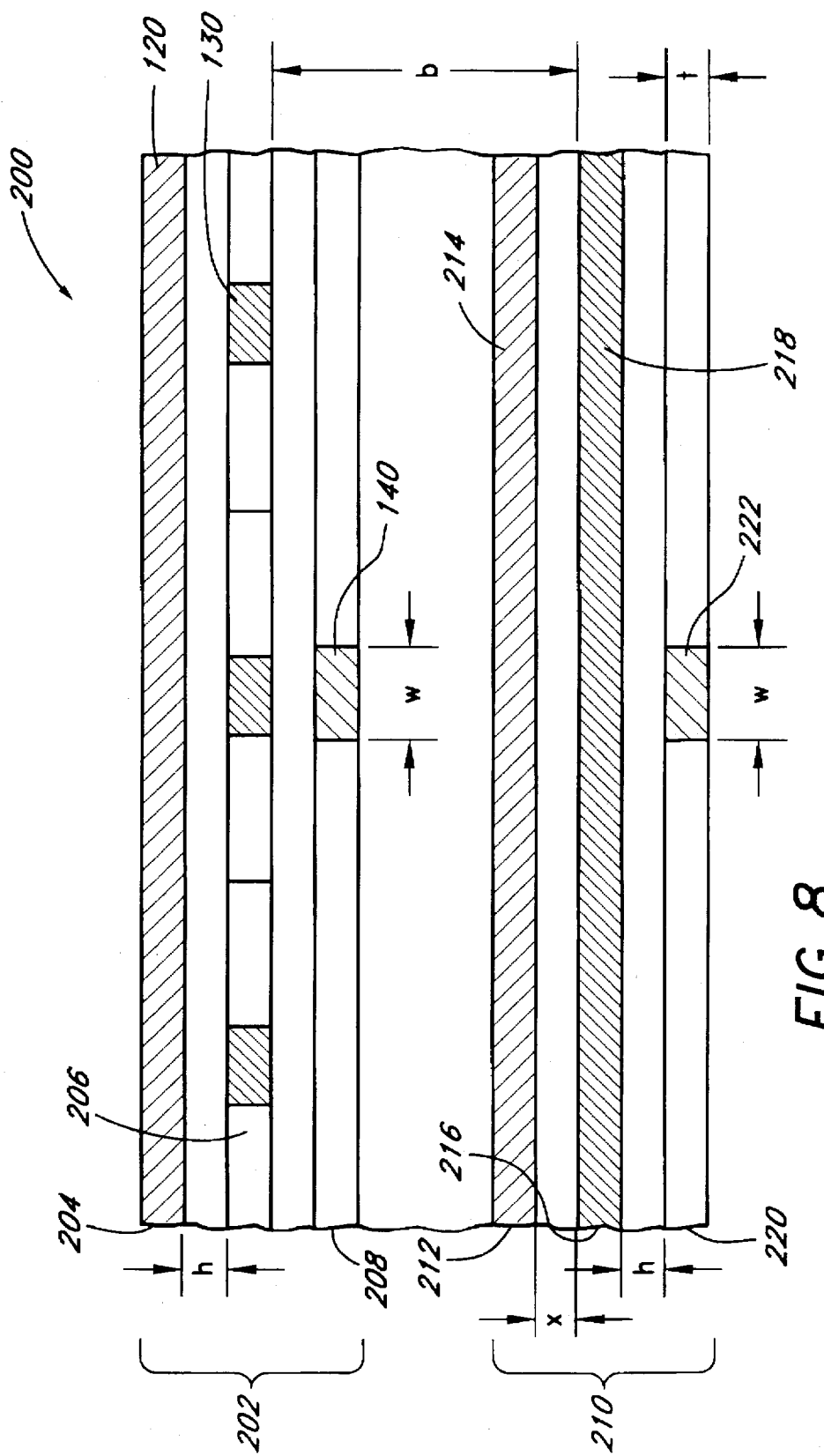
FIG. 8 depicts a cross sectional elevational view of one implementation of the circuit board of the present invention.

FIG. 8 illustrates a cross-sectional view of the present invention implemented within a six-layer circuit board 200. The top three layers 202 in FIG. 8 comprise the upper signal conductor 120, reference grid 130 and lower signal conductor 140 of the present invention. The signal conductor 120 is located on the first layer 204; the reference grid 130 is located on the second layer 206; and the lower signal conductor 140 is located on the third layer 208. The lower three layers 210 represent the transmission lines and reference planes of a conventional microstrip design. The first layer 212 of these three lower layers 210 comprises a first signal conductor 214; the second layer 216 of the three lower layers 210 comprises a solid reference plane 218; and the third layer 220 comprises a second signal conductor 222. The layers 204, 206, 208, 212, 216 and 220 are electrically insulated from each other by insulators, sandwiched together and held in place by suitable adhesives known in the art.

The relationship between the characteristic impedance and the distance between the conductor and the reference plane for a conventional microstrip transmission line is illustrated by the formula:

$$Z_0 = \frac{119.9}{\sqrt{2(\epsilon_r+1)}} \left[ \ln\left\{ 4\frac{h}{w} + \sqrt{16\left(\frac{h}{w}\right)^2 + 2} \right\} - \frac{1}{2}\left(\frac{\epsilon_r-1}{\epsilon_r+1}\right)\left(\ln\frac{\pi}{2} + \frac{1}{\epsilon_r}\ln\frac{4}{\pi}\right) \right] \quad (7)$$

where:

h is the separation between the surface conductor and the reference plane;

w is the width of the conductor; and $\epsilon_r$ is the dielectric constant of the material between the conductor and the reference plane.

The relationship between the characteristic impedance and the separation between the conductor and the reference planes for a conventional centered stripline is governed by the formula:

$$Z_0 = \frac{\eta_0}{2.0\pi\sqrt{E_r}} \ln\left\{ 1.0 + \frac{4.0(b-t)}{\pi w'} \left[ \frac{8.0(b-t)}{\pi w'} + \sqrt{\left(\frac{8.0(b-t)}{\pi w'}\right)^2 + 6.27} \right] \right\} \Omega \quad (8)$$

where:

$$w' = w + \frac{\Delta w}{t} t$$

$$\frac{\Delta w}{t} = \frac{1.0}{\pi} \ln\left[ \frac{e}{\sqrt{\left(\frac{1}{2.0\frac{(b-t)}{t+1}}\right)^2 + \left(\frac{\frac{1}{4\pi}}{\frac{w}{t}+1.1}\right)^m}} \right]$$

$$m = \frac{6.0}{3.0 + \frac{2.0t}{(b-t)}}$$

b is the separation between the conductor and solid reference plane;

t is the thickness of the conductor; and $n_0$ is the intrinsic impedance of the conductor.

Equations (7) and (8) provide more accurate representations of the relationship between the characteristic impedance and the separation between the conductor and reference plane(s) for the microstrip and stripline designs, respectively.

Conventionally, the impedance of circuit board transmission lines was increased by actually increasing the distance between the conductor and the reference plane. With reference to FIG. 8, Equation (7) and Equation (8), this would mean increasing h for the microstrip layers and b for stripline layers. As a result, all of the conductors on those layers would increase in impedance accordingly. If "ordinary" board impedances of 50 to 65 Ω are also required on the same plane as the high impedance layers, it would be necessary to increase the width (w) of the conductors to maintain the predominant 50 and 65 Ω impedances of the other signals on the board.

Unfortunately, the needed line width (w) would have to increase from the desired 4 or 5 mils to 27.3 and 16.4 mils respectively to maintain these impedances. These line widths will not fit between fine pitch device pads and, therefore, would have to be routed around integrated circuit chips such as those illustrated in FIG. 5. Furthermore, conductors of "ordinary" impedance that are routed from other layers onto the high impedance layer would need to have their widths adjusted from layer to layer to maintain matched impedance long their entire length. Even without the problems encountered with trying to route between fine pitch device pads, increasing h or b would result in approximately 2.7 times less signal density, since fewer signal lines can be implemented on the same layer. Additionally, the needed increase in b for a stripline conductor would result in a board thickness far exceeding the standard circuit board specification of 62 mils.

As discussed above, the present invention permits the construction of signal conductors, in selected areas, with a much wider range of impedances than in traditional design. This is done by the introduction of a new variable not considered in traditional microstrip and stripline designs, which has significant influence over the impedance of the conductor. This new variable is the percent copper used in the construction of the reference plane. Traditional references planes are solid. To increase the characteristic impedance conventionally, the separation between the signal conductor and the reference plane must be physically increased.

The present invention permits the increase of impedance without physically increasing the separation between signal conductors and the reference plane. Thus, impedance can be increased without increasing circuit board thickness. In addition, the impedance of signal conductors may be varied over a wide range by changing the percent copper used in the construction of the reference plane. The present invention also effectively eliminates the problems associated with traditional microstrip and stripline designs, as discussed above.

While the present invention has the apparent effect of increasing the distance between the signal conductor and the reference plane, it has this effect only in the area it is applied and only to the two signal layers immediately adjacent to the reference plane, thus not changing the characteristics of the transmission lines in the rest of the circuit board. Thus, in FIG. 8, the signal conductors 120 and 140 in layers 204 and 208, respectively, will exhibit high impedance by virtue of the grid 130 while the signal conductors 214 and 222 in layers 212 and 220 respectively, will not be affected by the existence of the grid 130 and will operate at normal impedance.

For instance, with design parameters of x=10 mils, b=40.8 mils, h=8 mils and an 8-mils wide conductor, the impedance of the signal conductor 120 (a microstrip) is approximately 92 ohms when a grid comprising 17% copper is used. Using the same design parameters and a 6-mils wide conductor, the impedance of the signal conductor 140 (a stripline) is approximately 92 ohms.

In addition, the effect of using a cross-hatch reference plane in layer two with 17% copper would leave the impedance for the signal conductor 214 in layer 212 virtually unaffected, while the impedance of signal conductor 222 in layer 220 is completely unaffected.

A further advantage of the present invention is the virtual elimination of one source of crosstalk, namely forward crosstalk, from those signals routed under the grid 130. Crosstalk is the effect of coupling the signal of one channel into another. Crosstalk may arise from a number of sources, one of which is the unbalance of cable parameters, in particular, the capacitance and inductance between conductors. Due to this unbalance, net coupling of the signal of one conductor into another can result.

Such unbalance is generally aggravated when a conductor is exposed to nonhomogeneous media, as is the case with traditional microstrip construction. This is because forward crosstalk is the result of the difference between odd and even trace velocities, as known in the art. In a homogeneous medium, the odd and even trace velocities are equal and cancel each other out, resulting in the elimination of forward crosstalk. In nonhomogeneous media, these two velocities are unequal, resulting in a non-zero factor and giving rise to forward crosstalk. In traditional constructions which permit high impedances, such as microstrip construction, conductors interface with at least three different dielectrics, typically FR-4, solder mask and air. This nonhomogeneous environment results in differing even and odd trace velocities which result in forward crosstalk.

In the present invention, signals can be routed in a quasi-stripline environment through the signal conductor 140 below the grid 130, particularly when it is necessary to run signals via conductors parallel to each other for electrically long distances. "Electrically long" distances are distances approaching λ/4 where maximum coupling occurs. Because the conductors 140, 142, 144 on layer 208 are routed in a nearly homogenous environment, the difference in the odd and even trace velocities is nearly zero and thus forward crosstalk approaches zero. As a result, the present invention virtually eliminates forward crosstalk.

Where a plurality of signal conductors are positioned in close proximity, such as the signal conductors 120, 122, 124 or 140, 142, 144 in FIG. 5, the conductors 120, 122, 124 or 140, 142, 144 are preferably offset with respect to each other by a distance d that is a multiple of one-half the diagonal distance D between the vertices of the squares formed by the conductive elements of the grid 130. The relationship between the offset and the diagonal distance D is illustrated in Equation (3).

This same positional relationship between the signal conductors 120, 122, 124 or 140, 142, 144 is preferably maintained even if the signal conductors 120, 122, 124 or 140, 142, 144 are not positioned to cross the grid 130 at the vertices of the squares. For example, if one conductor is positioned to pass a small distance from the vertices of the squares, the other conductors should pass the same distance from the vertices so that the impedances of the conductors are substantially equal.

In addition to the above described advantages, this new design allows unprecedented shielding for the high impedance lines routed under the reference grid. Since the present design allows the routing of high impedance conductors on both layers 204 (microstrip or embedded microstrip) and 208 (stripline, or quasi-stripline) in FIG. 8, it is possible to route high impedance signals only through conductors on layer 208 on a typical six-layer board. In addition, if more high impedance conductors are desired, a gridded reference plane may be used on layer 216, and conductor 214 on layer 212 will provide the required additional high impedance, while the grid on layer 216 will provide the necessary shielding.

For commercial purposes, it is desirable that the shielding provide an effectiveness of at least 20 decibels. The present design can provide significant attenuation of typical frequencies (100 MHz–500 MHz) encountered at near nanosecond rise times. The relationship between shielding effectiveness, the maximum dimension (D) of the slot, and the wavelength of the signal in the conductor is expressed in Equation (4). With a 23% metal area, a spacing D of approximately 0.060 inches provides a shielding effectiveness of approximately 29 dB, well within the 20 dB required for commercial purposes.

Figure 9:
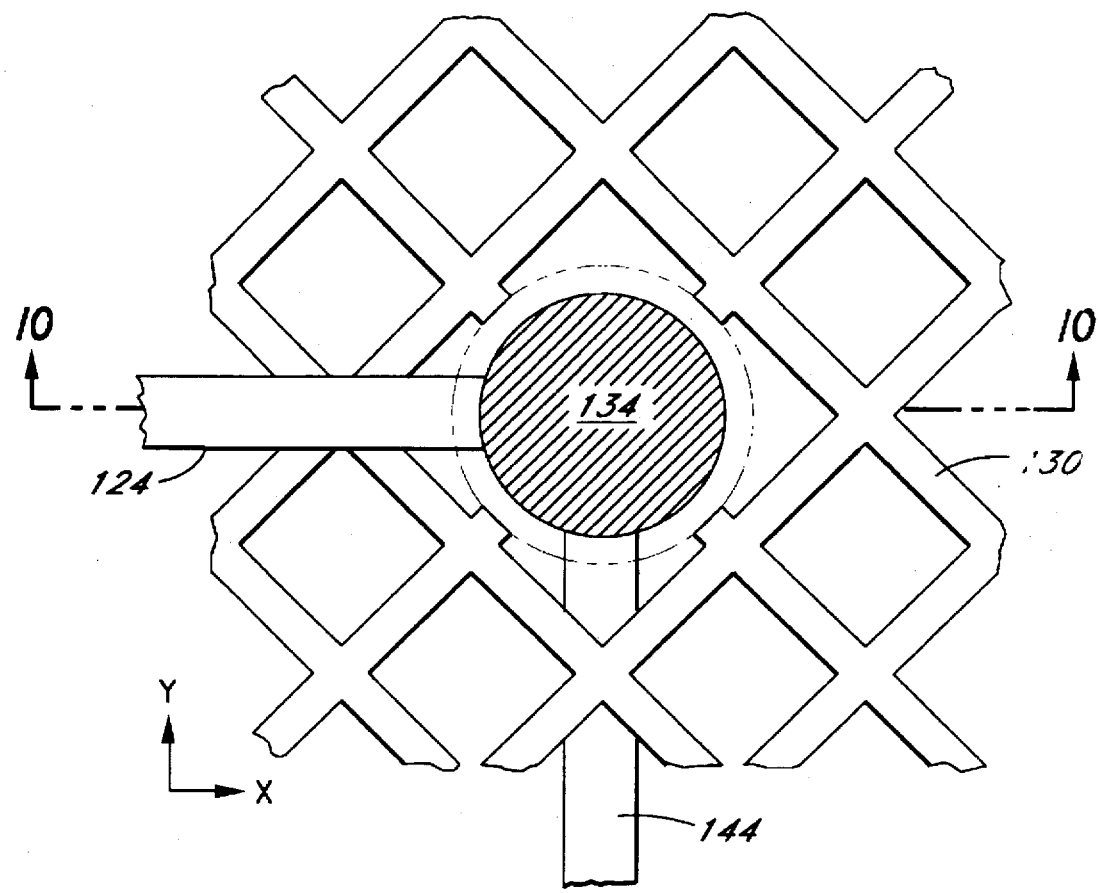
FIG. 9 depicts an enlarged plan view of a section 9—9 of the circuit board transmission lines of FIG. 5 illustrating a preferred method of executing a 90 degree turn in a signal conductor.
Figure 10:
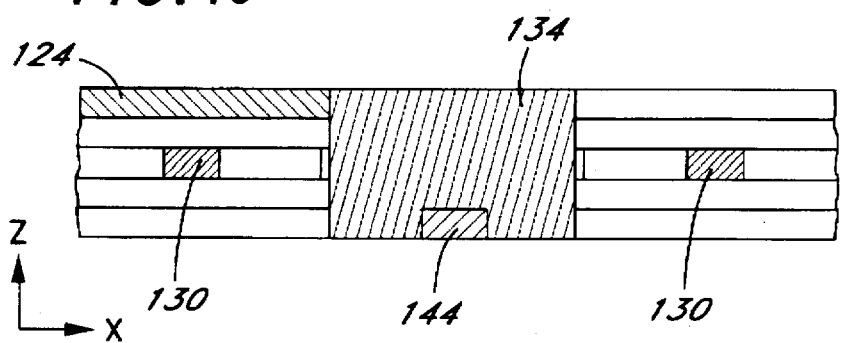
FIG. 10 depicts a cross sectional elevational view of one embodiment of the circuit board of the present invention taken along lines 10—10 of FIG. 9.

Occasionally, the signal conductors 120, 122, 124 or 140, 142, 144 have to be rerouted for a variety of reasons, for instance, to conform to design layouts or to make connections between ports that are not aligned along a line parallel to the Y axis. In such cases, the signal conductors 120, 122, 124 or 140, 142, 144 have to be reoriented to make such connections. As illustrated in FIGS. 5, 9 and 10, such changes in direction may be accomplished while keeping the impedance discontinuities of the signal lines to a minimum. To accomplish a ninety-degree change in direction, a signal conductor 124 located above a grid 130 is first oriented along the vertices of the grid 130 in a direction parallel to the X axis. A via 134 is drilled through the circuit boards comprising the first signal conductor 124 and the grid 130 to a second conductor 144 lying below the grid 130. The second conductor 144 is oriented at 90 degrees with respect to the first conductor 130 and also oriented along the vertices of the grid 130 in a direction parallel to the Y-axis. The first conductor 124 is electrically connected to the second conductor 144 by means of the via 134, which is filled with solder, as known in the art. In this manner, signal conductors may be rerouted while keeping discontinuities to a minimum.

Accordingly, the present invention allows the microstrip and stripline designer to select from a much wider range of impedances over traditional designs. This design is especially useful in providing very high impedance conductors in selected areas of a circuit board without increasing the thickness of standard circuit boards, without decreasing the width or thickness of signal conductors, and without resorting to the use of nonhomogeneous or nonstandard dielectrics. The present invention also provides high impedance while maintaining high signal density, a significant level of shielding, while reducing crosstalk between high impedance conductors.

Although this invention has been described in terms of a certain preferred embodiment, other embodiments apparent to those of ordinary skill in the art are also within the scope of this invention. Accordingly, the scope of the invention is intended to be defined only by the claims which follow.

What is claimed is:

1. A circuit board, comprising:
 a single, shielding grid having a predetermined configuration comprising conductive elements interconnected in a geometric pattern, said geometric pattern comprising an opening between said conductive elements;

a first conducting element, said first conducting element positioned adjacent to said grid so that said first conducting element is positioned at a first predetermined location with respect to said grid; and a second conducting element substantially parallel to said first conducting element and positioned at a second predetermined location with respect to said grid, said second conducting element spaced from said first conducting element by an offset, said offset being substantially equal to an integer multiple of half the distance of the largest dimension of said opening.

2. The circuit board of claim 1, wherein said circuit board further comprises a third conducting element adjacent to said grid and substantially perpendicular to said first conducting element, wherein said third conducting element is positioned at a third predetermined location with respect to said first conducting element.

3. The circuit board of claim 1, wherein said largest dimension of said opening is less than half a wavelength of a highest frequency of a signal conducted by one of said first and second conducting elements.

4. The circuit board of claim 3, wherein said largest dimension of said opening is less than one-twentieth of the wavelength the highest frequency of a signal conducted by one of said first and second conducting elements.

5. The circuit board of claim 4, further comprising a third conducting element, substantially parallel to said first and second conducting elements.

6. The circuit board of claim 5, wherein said third conducting element is located at an offset of an integer multiple of half the distance of said largest dimension of said opening of said grid from said second conducting element.

7. The circuit board of claim 1, wherein said first predetermined location of said first conducting element is determined by vertices of said grid.

8. The circuit board as defined in claim 1, wherein said opening of said geometric pattern is substantially square.

9. The circuit board of claim 1, wherein said circuit board comprises a third conducting element located below said grid.

10. A circuit board, comprising:
a shielding grid having a predetermined configuration comprising first and second sets of conductive elements interconnected in a geometric pattern, wherein conductive elements of said first set are substantially perpendicular to conductive elements of said second set;

a first conducting element positioned above said grid at an angle of approximately 45 degrees with respect to said conductive elements of said first and second sets, and positioned so as to extend from a first vertex to a second vertex of substantially square openings in said grid; and a second conducting element positioned below said grid, at a predetermined location with respect to said first conducting element.

11. The circuit board of claim 10, wherein said second conducting element is substantially perpendicular to said first conducting element.

12. The circuit board of claim 10, wherein said circuit board comprises a third conducting element located above said grid.

13. A circuit board, comprising:
a shielding grid with a predetermined configuration of intersecting conductors defined in a first plane;

a first conducting element positioned above said grid so that said first conducting element crosses over said grid at locations that are a predetermined distance from intersections of said intersecting conductors of said grid; and a second conducting element positioned below said grid so that said second conducting element is positioned at a second predetermined location with respect to said first conducting element.

14. A method of constructing a circuit board, comprising the steps of:
positioning a single shielding grid with a first predetermined configuration in a first plane;

positioning a conducting element in a second plane adjacent to said grid so that said conducting element passes over conductive elements of said grid only at points of intersection of conductive elements in said grid; and positioning a second conductive element in a third plane, said third plane being parallel with and adjacent to said grid, so that said second conducting element is substantially perpendicular to said first conducting element.

15. A circuit board comprising:
a grid comprising a first plurality of conductive elements oriented in a first direction and a second plurality of conductive elements oriented in a second direction perpendicular to said first direction so that said first plurality of conductive elements and said second plurality of conductive elements form a plurality of squares, said squares having vertices corresponding to the intersections of said first and second pluralities of conductive elements, said vertices having a diagonal distance therebetween along diagonal directions at 45 degrees to said first and second directions;

a first plurality of signal conductors positioned adjacent said grid and oriented in a direction substantially parallel to one of said diagonal directions, each signal conductor of said first plurality of signal conductors passing over conductive elements in said grid only at said vertices in said grid; and a second plurality of signal conductors positioned adjacent said grid, oriented in a direction away from said first plurality of signal conductors, and in a direction substantially perpendicular to said first plurality of signal conductors, each signal conductor of said second plurality of signal conductors passing over conductive elements in said grid only at said vertices in said grid.

16. A circuit board, comprising:
a single shielding grid having a predetermined configuration comprising conductive elements interconnected in a geometric pattern, said geometric pattern comprising an opening between said conductive elements, a largest dimension of said opening being less than one-twentieth a wavelength of a highest frequency of any signal conducted within said circuit board;

a first conducting element positioned adjacent to said grid so that said conducting element is positioned at a predetermined location with respect to said grid; and a second conducting element, substantially parallel to said first conducting element and spaced from said first conducting element by an offset of an integer multiple of half the distance of the largest dimension of said opening of said grid.

17. A circuit board, comprising: a shielding grid having a predetermined configuration comprising conductive elements interconnected in a geometric pattern; a first conducting element positioned above said grid, at a first predetermined location with respect to said grid; and a second conducting element positioned below said grid, at a second predetermined location with respect to said first conducting element and substantially perpendicular to said first conducting element.

18. A circuit board, comprising:
   a shielding grid having a predetermined configuration comprising conductive elements interconnected in a geometric pattern;
   a first conducting element positioned above said grid, at a first predetermined location with respect to said grid;
   a second conducting element positioned below said grid, at a second predetermined location with respect to said first conducting element; and
   a third conducting element located above said grid.

19. A circuit board which provides a plurality of electrical interconnections having a desired impedance, said circuit board comprising:
   a shielding grid having a pattern of conductive elements and voids, said conductive elements having intersections which define said voids between said intersections; and
   a plurality of electrical conductors positioned substantially parallel with and proximate to said shielding grid, said plurality of electrical conductors having respective impedance controlled portions, said impedance controlled portions positioned with respect to said intersections such that impedance controlled portions having said desired impedance are positioned like distances from said intersections.

20. A circuit board which provides a plurality of electrical interconnections having a desired impedance, said circuit board comprising: a first shielding grid having a first configuration of a first set of intersecting electrically conductive elements interconnected in a first pattern defined by intersections of said first set of electrically conductive elements;
   a second shielding grid having a second configuration of a second set of intersecting electrically conductive elements interconnected in a second pattern defined by intersections of said second set of electrically conductive elements; and
   a plurality of electrical conductors having said desired impedance, said plurality of electrical conductors positioned between said first and second shielding grids, each of said plurality of electrical conductors being located a first distance having a first horizontal component from said intersections of said first shielding grid and located a second distance having a second horizontal component from said intersections of said second shielding grid, said first horizontal component and said second horizontal component selected to cause each of said plurality of electrical conductors to have said desired impedance.

21. The circuit board as defined in claim 20, wherein said intersections of said first pattern are spaced apart by a first grid spacing, and wherein said electrical conductors having said desired impedance are spaced apart from each other by a multiple of one-half of said grid spacing.

22. The circuit board as defined in claim 20, wherein said intersections of said first pattern are spaced apart by a first grid spacing, and wherein said intersections of said second pattern are spaced apart from said intersections of said first pattern by one-half said first grid spacing.

23. The circuit board as defined in claim 20, wherein each electrical conductor having said desired impedance is aligned with said first intersections.

24. A circuit board which provides a plurality of electrical interconnections having a desired impedance, said circuit board comprising:
   a shielding grid having a pattern of conductive elements and voids, said conductive elements having intersections which define said voids between said intersections; and
   a plurality of electrical conductors positioned substantially parallel with and proximate to said shielding grid, said plurality of electrical conductors having respective impedance controlled portions, said impedance controlled portions positioned with respect to said intersections such that impedance controlled portions having said desired impedance are positioned like distances from said intersections.

25. A circuit board which provides a plurality of electrical interconnections having a desired impedance, said circuit board comprising:
   a shielding grid having a pattern of conductive elements and voids, said conductive elements having intersections which define said voids between said intersections, said intersections being spaced apart by a first distance measured across said voids; and
   a plurality of electrical conductors positioned substantially parallel with and proximate to said shielding grid, said plurality of electrical conductors having respective impedance controlled portions, said impedance controlled portions positioned with respect to said intersections such that impedance controlled portions having said desired impedance are positioned like distances from said intersections, said impedance controlled portions of at least first and second adjacent ones of said plurality of electrical conductors spaced apart from each other by an integer multiple of one-half said first distance.

26. A circuit board which provides a plurality of electrical interconnections having a desired impedance, said circuit board comprising:
   a shielding grid having a pattern of conductive elements and voids, said conductive elements having intersections which define said voids between said intersections, said intersections being spaced apart by a first distance measured across said voids; and
   a plurality of electrical conductors positioned substantially parallel with and proximate to said shielding grid, said plurality of electrical conductors positioned with respect to said intersections at like distances from said intersections such that each of said plurality of electrical conductors has said desired impedance, at least first and second adjacent ones of said plurality of electrical conductors spaced apart from each other by an integer multiple of one-half said first distance.

27. A circuit board which provides a plurality of electrical interconnections having a desired impedance, said circuit board comprising:
   a first shielding grid having a pattern of conductive elements and voids, said conductive elements having intersections which define said voids between said intersections, said intersections being spaced apart by a first distance measured across said voids;
   a second shielding grid having a pattern of conductive elements and voids, said conductive elements having intersections which define said voids between said intersections, said intersections being spaced apart by said first distance measured across said voids, said second shielding grid offset from said first shielding grid by a second distance, said second distance being approximately one-half said first distance; and
   a plurality of electrical conductors positioned between said first and second shielding grids, each of said plurality of electrical conductors positioned with respect to said intersections at a third distance from said intersections, at least first and second adjacent ones of said plurality of electrical conductors spaced apart from each other by an integer multiple of said second distance, said third distance selected to cause said plurality of electrical conductors to have said desired impedance.

28. A method of constructing a circuit board having a plurality of signal conductors with a desired impedance, said method comprising the steps of:

positioning a shielding grid in a first plane, said shielding grid including a plurality of interconnected electrically conductive elements forming a pattern of intersections and voids, said intersections being spaced apart from adjacent intersections across said voids by a first distance; and positioning a plurality of signal conductors having said desired impedance in a second plane parallel to said first plane, each signal conductor being positioned a second distance from said intersections of said shielding grid, each signal conductor being spaced apart from an adjacent signal conductor having said desired impedance by an integer multiple of one-half said first distance.

29. The method as defined in claim 28, wherein said second distance is measured in said second plane, and wherein said second distance is substantially zero such that each signal conductor having said desired impedance is positioned over said intersections of said shielding grid.

30. A circuit board which provides electrical interconnections having a desired impedance, said circuit board comprising:

a shielding grid having a pattern of conductive elements and voids, said conductive elements having intersections which define said voids between said intersections; and a multiplicity of electrical conductors positioned substantially parallel with and proximate to said shielding grid in parallel with each other, at least substantially all of said multiplicity of electrical conductors being positioned like distances from said intersections of said shielding grid so as to have said desired impedance.

31. An impedance controlled circuit board, comprising:

a reference plane which includes a multiplicity of intersecting conductive elements which define intersections and voids in said reference plane; and a plurality of signal conductors in a second plane parallel to said reference plane, said signal conductors positioned in said second plane with respect to said intersections and voids such that adjacent signal conductors have substantially equivalent capacitive coupling to said reference plane and thereby have substantially equivalent impedances.

32. A method of controlling the impedance of signal conductors in a circuit board, said method comprising the steps of:

providing a multiplicity of intersecting conductive elements in a reference plane, said intersecting conductive elements defining intersections and voids in said reference plane; and selecting positions for a plurality of signal conductors in a second plane parallel to said first plane, said signal conductors positioned with respect to said intersections and voids in said reference plane such that said signal conductors have substantially equivalent capacitive coupling to said reference plane and thereby have substantially equivalent impedances.

33. A method of controlling the impedance of shielded signal conductors in a circuit board, said method comprising the steps of:

providing a first multiplicity of intersecting conductive elements in a first reference plane, said first multiplicity of conductive elements defining intersections and voids in said first reference plane;

providing a second multiplicity of intersecting conductive elements in a second reference plane parallel to said first reference plane, said second multiplicity of conductive elements defining intersections and voids in said second reference plane, said second reference plane offset laterally with respect to said first reference plane such that intersections in said second reference plane are positioned proximate to voids in said first reference plane; and selecting positions for a plurality of signal conductors in a signal plane parallel to and between said first and second reference planes, said positions for said signal conductors selected with respect to said intersections and voids of said first and second reference planes such that said signal conductors have substantially equivalent capacitive coupling to said reference planes and thereby have substantially equivalent impedances.

34. An impedance controlled circuit board having shielded signal conductors, said circuit board comprising:

a first multiplicity of intersecting conductive elements in a first reference plane, said first multiplicity of conductive elements defining intersections and voids in said first reference plane;

a second multiplicity of intersecting conductive elements in a second reference plane parallel to said first reference plane, said second multiplicity of conductive elements defining intersections and voids in said second reference plane, said second reference plane offset laterally with respect to said first reference plane such that intersections in said second reference plane are positioned proximate to voids in said first reference plane; and a plurality of signal conductors in a signal plane parallel to and between said first and second reference planes, said signal conductors positioned with respect to said intersections and voids of said first and second reference planes such that adjacent signal conductors have substantially equivalent capacitive coupling to said reference planes and thereby have substantially equivalent impedances.

35. A method of designing a shielded circuit laminate having a multiplicity of intersecting conductive elements in a reference plane, said intersecting conductive elements defining intersections and voids in said reference plane, said circuit laminate further having a signal conductor in a second plane parallel to said first plane, said method comprising the steps of:

determining the capacitive coupling between said signal conductor and said conductive elements in said reference plane as a function of the position of said conductor with regard to said intersections and voids in said reference plane, and positioning said conductor in the finished circuit laminate based upon said function to provide a desired impedance at a selected frequency resulting from said determined capacitive coupling.

36. A method of designing a shielded circuit laminate having a multiplicity of intersecting conductive elements in a reference plane, said intersecting conductive elements defining intersections and voids in said reference plane, said circuit laminate having a second multiplicity of intersecting conductive elements in a second reference plane parallel to said first reference plane offset laterally with respect to said first reference plane such that intersections in said second reference plane are positioned proximate to voids in said reference plane, said circuit laminate having a signal conductor in a second plane parallel to said first plane, said method comprising the steps of:

determining the capacitive coupling between said signal conductor and said conductive elements in said reference planes as a function of the position of said conductor with regard to said intersections and voids in said reference planes, and positioning said conductor in the finished circuit laminate based upon said function to provide a desired impedance at a selected frequency resulting from said determined capacitive coupling.

\* \* \* \* \*